(12) United States Patent
Xie

(10) Patent No.: US 10,170,629 B2
(45) Date of Patent: Jan. 1, 2019

(54) FIELD-EFFECT TRANSISTOR AND THE MANUFACTURING METHOD

(71) Applicant: Shenzhen China Star Optoelectronics Technology Co., Ltd., Shenzhen, Guangdong (CN)

(72) Inventor: Huafei Xie, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 57 days.

(21) Appl. No.: 15/529,082

(22) PCT Filed: Apr. 25, 2017

(86) PCT No.: PCT/CN2017/081774
§ 371 (c)(1),
(2) Date: May 23, 2017

(65) Prior Publication Data
US 2018/0331231 A1 Nov. 15, 2018

(30) Foreign Application Priority Data
Mar. 30, 2017 (CN) .......................... 2017 1 0203713

(51) Int. Cl.
*H01L 29/786* (2006.01)
*H01L 21/02* (2006.01)
(Continued)

(52) U.S. Cl.
CPC .......... *H01L 29/78684* (2013.01); *C09D 5/24* (2013.01); *C09D 7/67* (2018.01); *H01L 21/0206* (2013.01); *H01L 21/02271* (2013.01); *H01L 21/02527* (2013.01); *H01L 21/02601* (2013.01); *H01L 21/02628* (2013.01); *H01L 21/02664* (2013.01); *H01L 21/042* (2013.01);
(Continued)

(58) Field of Classification Search
CPC ..... G02F 2001/01791; H01L 29/78684; C09D 7/67
USPC ................................ 257/24; 977/774; 438/20
See application file for complete search history.

(56) References Cited

U.S. PATENT DOCUMENTS

2008/0283903 A1   11/2008  Grabowski et al.
2015/0361334 A1*  12/2015  Kwon ................. H01L 51/0045
                                                     252/301.16
2017/0174921 A1*   6/2017  He .......................... H01L 51/56

FOREIGN PATENT DOCUMENTS

CN         1832208 A      9/2006
CN       101923065 A     12/2010
(Continued)

*Primary Examiner* — Jami Valentine Miller
(74) *Attorney, Agent, or Firm* — Andrew C. Cheng

(57) ABSTRACT

A field-effect transistor and a manufacturing method thereof are provided. The method includes depositing a first insulating layer on a substrate; forming a source electrode and a drain electrode on the first insulating layer; forming a carbon quantum dots active layer covering the source electrode and the drain electrode; and forming a second insulating layer and a gate electrode on the carbon quantum dots active layer sequentially. According to the above method, the present disclosure making the field-effect transistor active layer with carbon quantum dots as materials, which enriches the material of the field-effect transistor, reduces the environmental pollution in current technology by using metal dots film, and reduces the dependence on metal elements.

5 Claims, 5 Drawing Sheets

(51) Int. Cl.
  *H01L 21/04* (2006.01)
  *H01L 29/16* (2006.01)
  *H01L 29/66* (2006.01)
  *H01L 29/12* (2006.01)
  *C09D 7/40* (2018.01)
  *C09D 5/24* (2006.01)
  *B82Y 40/00* (2011.01)
  *H01L 29/45* (2006.01)
  *H01L 29/417* (2006.01)
  *B82Y 30/00* (2011.01)

(52) U.S. Cl.
  CPC .......... *H01L 21/043* (2013.01); *H01L 21/044* (2013.01); *H01L 29/127* (2013.01); *H01L 29/16* (2013.01); *H01L 29/66045* (2013.01); *H01L 29/78696* (2013.01); *B82Y 30/00* (2013.01); *B82Y 40/00* (2013.01); *H01L 21/0217* (2013.01); *H01L 21/02164* (2013.01); *H01L 21/02178* (2013.01); *H01L 29/41733* (2013.01); *H01L 29/45* (2013.01)

(56) References Cited

FOREIGN PATENT DOCUMENTS

| CN | 102086393 A | 6/2011 |
| CN | 103531623 A | 1/2014 |
| CN | 104357047 A | 2/2015 |

\* cited by examiner

FIELD-EFFECT TRANSISTOR AND THE MANUFACTURING METHOD

FIELD OF THE INVENTION

The present disclosure relates to a technical field of display, and more particularly relates to a field-effect transistor and a manufacturing method thereof.

BACKGROUND OF THE INVENTION

The channel conduction condition of field-effect transistor is determined by surface effect of semiconductor, and controlling the hole and electronic exhaustion or accumulation on the active layer surface of the semiconductor by the gate electrode voltage, so as to achieve switching function. Because of the simple principle, mature technology and high reliability of the field-effect transistor, it has been widely applied in the electronic devices and integrated circuits. The performance of the field-effect transistor is effected by many factors such as craft, process, material and device structure, in which the channel material and device structure are fundamentally determining the mobility and efficiency of the field-effect transistor.

Since quantum size effects of the colloidal quantum has discovered, thin film technology is greatly applied in the field of electronics and optoelectronics. Based on the advantages of adjustable size gap, small exciton binding energy, high electrification and photoluminescence efficiency, and inexpensive solution process, quantum dots has been successfully applied in thin film optoelectronic devices such as solar cells and light emitting diodes. However, the charge transport properties and applications of the quantum dots film field-effect transistors still rarely reported, far behind the commercial silicon transistors and the organic field-effect transistors.

The semiconductor quantum dots colloid realizes an effective overlap and coincidence of quantum electrons or hole wave functions by close-packed self-assembly, and will form a new type of "artificial thin film". This solid film not only retains the unique tunability of quantum dots material properties, but also has high carrier mobility and electrical conductivity. Compared with silicon-based transistors, the field-effect transistor with quantum dots as the carrier transport layer has the advantages of simple manufacturing process, low cost, good weight and good flexibility. These features, which make the quantum dots field effect transistor become an important component of the future electronics industry, it can be widely used in smart cards, memory, electronic trademarks, margin matrix displays and sensors.

Currently, carbon element is one of the most abundant materials in nanostructures with varying properties, such as carbon quantum dots, carbon nanotubes and graphene all have excellent chemical, physical, mechanical and electrical properties that bringing great research interests and experimental applications for researchers. The carbon-based electronics has attracted more and more attentions because of its small size, fast speed, low power consumption, simple technology and other characteristics. Among many carbon nanomaterials, the carbon quantum dots are zero-dimensional nanoparticles with size less than 10 nm, because of the low cost, low toxicity, long-term stability, efficient carrier generation ability, easy to prepare, and the optical response is able to be adjusted by the particle size, carbon quantum dots become the ideal alternative material to the traditional semiconductor quantum dots.

SUMMARY OF THE INVENTION

The objective of the present disclosure is to provide a field-effect transistor and a manufacturing method thereof, it is aimed to solve the problem of how to make field-effect transistors by using the carbon quantum dots.

To solve the above technical problem, an aspect of the present disclosure is: providing a method for manufacturing a field-effect transistor, which comprises: depositing a first insulating layer on a substrate; forming a source electrode and a drain electrode on the first insulating layer; forming a carbon quantum dots active layer covering the source electrode and the drain electrode; and forming a second insulating layer and a gate electrode on the carbon quantum dots active layer sequentially. Wherein forming the carbon quantum dots active layer covering the source electrode and the drain electrode comprises: dissolving the carbon quantum dots in octane to form a first mixed solution; coating the first mixed solution on the first insulating layer, the source electrode and the drain electrode by a spin coating technology to form the carbon quantum dots film layer; and vacuum baking the carbon quantum dots film to form the carbon quantum dots active layer covering the source electrode and the drain electrode. Wherein the first insulating layer depositing on a substrate further comprises: forming a first material layer on the substrate by a chemical vapor deposition method, the first material layer is a silicon oxide layer, an alumina layer, a silicon nitride layer, or a mixed layer of silicon oxide, aluminum oxide and silicon nitride; soaking and rinsing the first material layer with a second mixed solution; and drying the first material layer after soaking and rinsing to form the first insulating layer.

To solve the above technical problem, another aspect of the present disclosure is: providing a field-effect transistor manufacturing method, which comprises: depositing a first insulating layer on a substrate; forming a source electrode and a drain electrode on the first insulating layer; forming a carbon quantum dots active layer covering the source electrode and the drain electrode; and forming a second insulating layer and a gate electrode on the carbon quantum dots active layer sequentially.

To solve the above technical problem, still another aspect of the present disclosure is used: providing a field-effect transistor, which comprises: a source electrode and a drain electrode on a substrate; and an active layer in contact with the source electrode and the drain electrode, wherein the active layer is a carbon quantum dots active layer.

The beneficial effects of the present disclosure are: apart from the current technologies, the present disclosure provides a method of depositing a first insulating layer on a substrate; forming a source electrode and a drain electrode on the first insulating layer; forming a carbon quantum dots active layer covering the source electrode and the drain electrode; and forming a second insulating layer and a gate electrode on the carbon quantum dots active layer. Making the field-effect transistor active layer with carbon quantum dots as materials, which enriches the material of the field-effect transistor, reduces the environmental pollution in current technology by using metal dots film, and reduces the dependence on metal elements.

DETAILED DESCRIPTION OF PREFERRED EMBODIMENTS

To enable those skilled in the field better understand the technical solution of the present disclosure, a following further detailed description of the field-effect transistor and the manufacturing method according to the present disclosure provides the accompanying figures and specific embodiments as follows.

Figure 1:
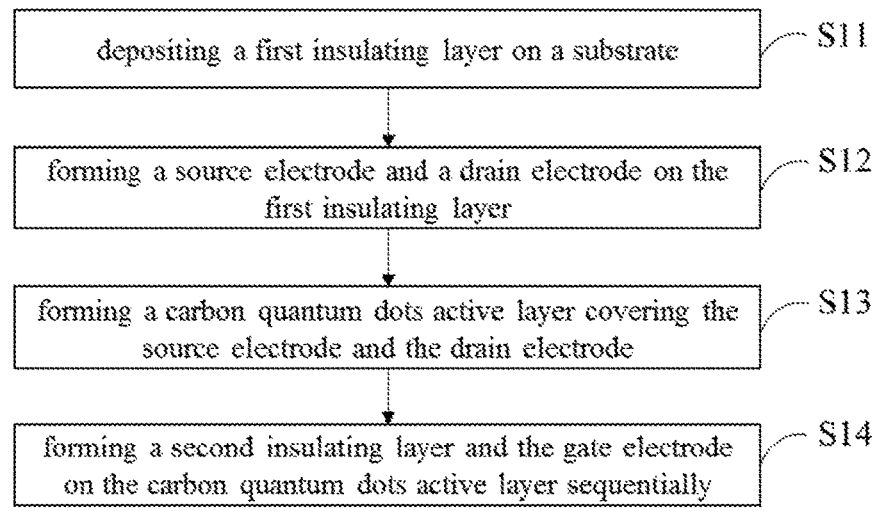
FIG. 1 is a schematic flow diagram showing the field-effect transistor manufacturing method embodiment in the present disclosure.
Figure 2:
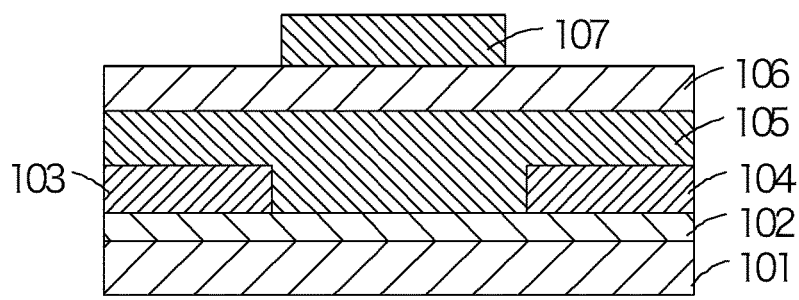
FIG. 2 is a schematic structure diagram showing the first embodiment of field-effect transistor by steps in FIG. 1.

Referring to FIG. 1 and FIG. 2, the present disclosure provides a field-effect transistor manufacturing method embodiment, which comprising:

S11: depositing a first insulating layer 102 on a substrate 101.

Figure 3:
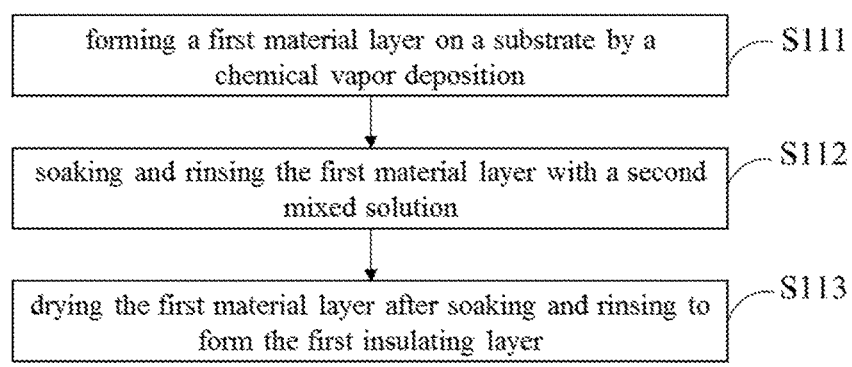
FIG. 3 is a schematic specific flow diagram of step S11 in FIG. 1.

Referring to FIG. 3, the step S11 specifically comprises:

S111: forming a first material layer on the substrate 101 by a chemical vapor deposition method.

Specifically, by a using chemical vapor deposition method, forming the first material layer with a certain thickness on a substrate, includes but not limited to silicon wafers, glass and plastic substrates.

Wherein the first material layer may be a silicon oxide layer, an aluminum oxide layer or a silicon nitride layer, it may also be a plurality of mixed layers in silicon oxide, aluminum oxide and silicon nitride; the thickness of the first material layer may be determined depending on the actual manufacturing. For example, the thickness in this embodiment is 200 nm.

S112: soaking and rinsing the first material layer with a second mixed solution.

Specifically, the second mixed solution of acetone, methanol and isopropanol is used for soaking and rinsing the first material layer.

S113: drying the first material layer after soaking and rinsing to form the first insulating layer 102.

Specifically, the first material layer after soaking and rinsing can be dried in the temperature environment of 100° C., the first insulating layer 102 can be formed after drying.

S12: forming a source electrode 103 and a drain electrode 104 on the first insulating layer 102.

Figure 4:
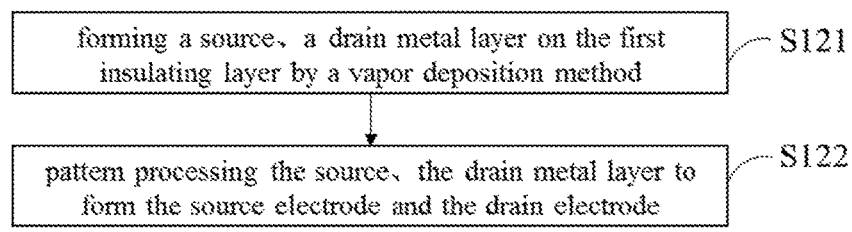
FIG. 4 is a schematic specific flow diagram of step S12 in FIG. 1.

Referring to FIG. 4, the step S12 specifically comprises:

S121: forming a source metal layer a drain metal layer on the first insulating layer 102 by a vapor deposition method.

Specifically, the source metal layer and drain metal layer may be formed by heating and plating on the first insulating layer 102 by vapor deposition equipment, such as a deposition machine in a vacuum environment, which include, but not limited to metallic aluminum, silver, copper, titanium.

S122: pattern processing the gate metal layer and the drain metal layer to form the source electrode 103 and the drain electrode 104.

Specifically, the source metal layer and the drain metal layer are exposed, developed, etched and stripped to form the patterned source electrode 103 and the drain electrode 104.

Preferably, the area of the source electrode 103 and the drain electrode 104 is 200 μm×300 μm, the distance between the source electrode 103 and the drain electrode 104 is 10 μm to 50 μm.

S13: forming a carbon quantum dots active layer 105 covering the source electrode 103 and the drain electrode 104.

Figure 5:
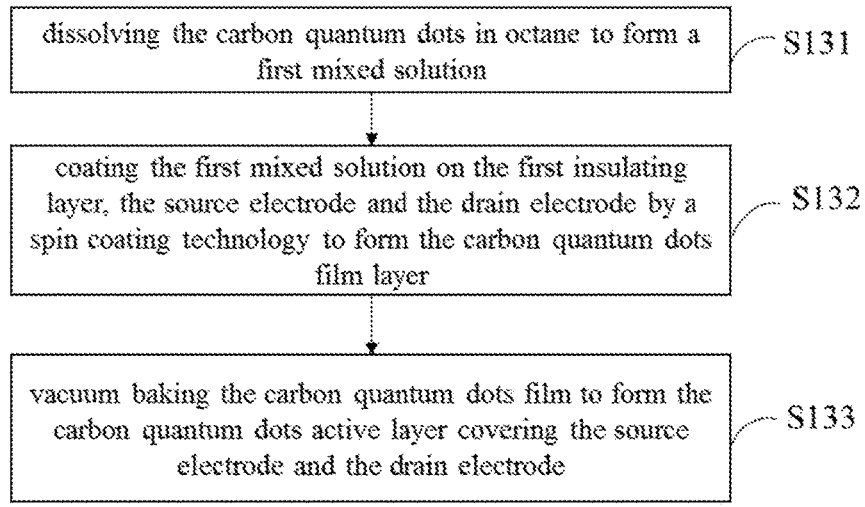
FIG. 5 is a schematic specific flow diagram of step S13 in FIG. 1.

Referring to FIG. 5, the step S13 specifically comprises:

S131: dissolving the carbon quantum dots in octane to form a first mixed solution.

A carbon quantum dot, also known as a carbon point or a carbon nano-point, is a type of spherical carbon particle, is a fluorescent carbon nanomaterial composed of carbon skeleton and a surface group having a particle size of less than 10 nm. It has the advantages of low toxicity, good biocompatibility, emission wavelength tunable and easy functional.

Wherein the carbon quantum dots with different particle sizes can be manufactured by electrochemical method, laser ablation method, pyrolysis method, template method and microwave assisted method, but not limited to. For example, by using a laser ablation method, the carbon nanoparticles are cut from the surface of the graphite powder by laser ablation and mixed with the organic polymer to obtain carbon quantum dots with a diameter of less than 5 nm and having photoluminescence properties. For another example, carbon quantum dots can also be obtained by pyrolysis of organic matter.

Preferably, the concentration of carbon quantum dots in the first mixed solution is 2.5 mg/ml.

S132: coating the first mixed solution on the first insulating layer 102, the source electrode 103 and the drain electrode 104 by a spin coating technology to form the carbon quantum dots film layer.

Specifically, the first mixed solution containing carbon quantum dots is added dropwise to the first insulating layer 102, the source electrode 103 and the drain electrode 104 in a glove box containing a high purity inert gas, and spin coating a certain thickness of the carbon quantum dots film layer in a certain period.

Preferably, the inert gas is nitrogen, the number of revolutions of the spin coating process is 3000 rpm, and the spin coating time is 30 s.

S133: vacuum baking the carbon quantum dots film to form the carbon quantum dots active layer 105 covering the source electrode 103 and the drain electrode 104.

For example, the carbon quantum dots film layer is baked in a vacuum environment of 80° C., and the carbon quantum dots active layer 105 covering the source electrode 103 and the drain electrode 104 can be formed after about 12 hours.

S14: forming a second insulating layer 106 and a gate electrode 107 on the carbon quantum dots active layer 105 sequentially.

Figure 6:
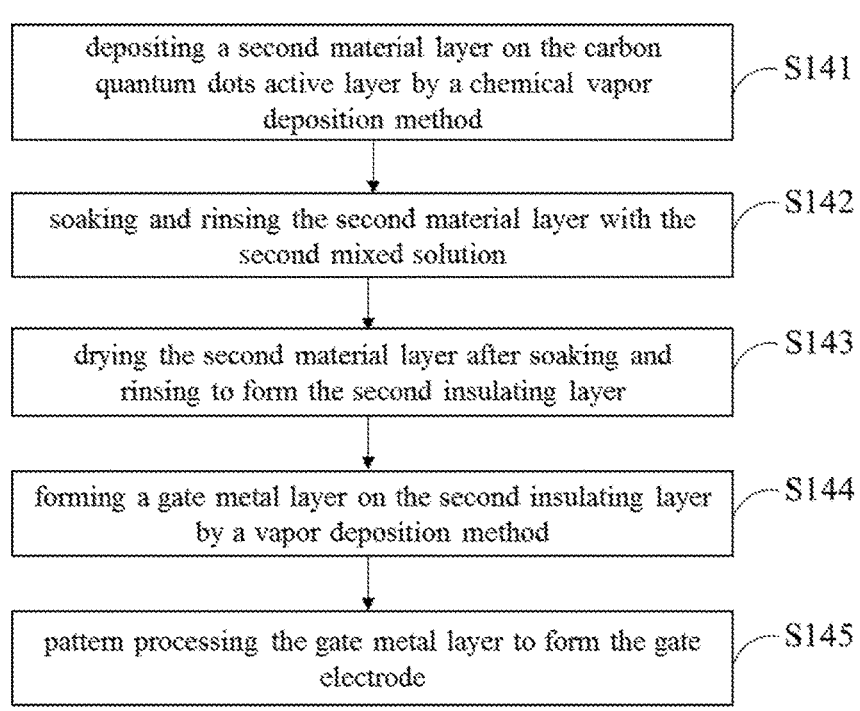
FIG. 6 is a schematic specific flow diagram of step S14 in FIG. 1.

Referring to FIG. 6, the step specifically comprises:

S141: depositing a second material layer on the carbon quantum dots active layer 105 by a chemical vapor deposition method.

Wherein the second material layer may be a silicon oxide layer, an aluminum oxide layer or a silicon nitride layer, it may also be a plurality of mixed layers in silicon oxide, aluminum oxide and silicon nitride; the thickness of the second material layer may be determined depending on the actual manufacturing. For example, the thickness in this embodiment is 300 nm.

S142: soaking and rinsing the second material layer with the second mixed solution.

Specifically, the second mixed solution of acetone, methanol and isopropanol is used for soaking and rinsing the first material layer.

S143: drying the second material layer after soaking and rinsing to form the second insulating layer 106.

Specifically, drying the second material layer in the temperature environment of 100° C., after soaking and rinsing to form the second insulating layer 106.

S144: forming a gate metal layer on the second insulating layer 106 by a vapor deposition method.

Specifically, the gate metal layers may be formed by heating and plating on the second insulating layer 106 by vapor deposition equipment, such as a deposition machine in a vacuum environment, and the gate metal layer includes, but not limited to metallic aluminum, silver, copper, titanium, or the mixed metal.

S145: pattern processing the gate metal layer to form the gate electrode 107.

Specifically, the gate metal layer is exposed, developed, etched and stripped to form the patterned source electrode 107.

As can be seen, the present embodiment is a method of manufacturing thin film transistor by adopting carbon quantum dots active layer. Based on the thin film transistor prepared by the present embodiment includes a top gate type thin film transistor and a bottom gate type thin film transistor, both include the carbon quantum dot active layer, and the other layers are prepared by the corresponding steps in the above method.

Referring to FIG. 2, the present disclosure provides a first embodiment of the field-effect transistor, comprising: the source electrode 103, the drain electrode 104 on the substrate 101, and the active layer 105 in contact with the source electrode 103 and the drain electrode 104.

Wherein the active layer 105 is a carbon quantum dots active layer.

Further, the field-effect transistor in the present embodiment further includes the first insulating layer 102 on the substrate 101 the second insulating layer 106 on the active layer 105, and the gate electrode 107 on the insulating layer, wherein the source electrode 103, the drain electrode 104 on the first insulating layer 102, and the active layer 105 covering the source electrode 103 and the drain electrode 104.

Wherein the field-effect transistor in the present embodiment is manufactured by the above method, and will not be described again.

Figure 7:
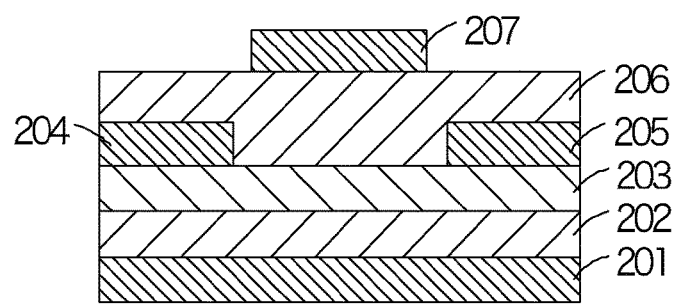
FIG. 7 is a schematic structure diagram showing the second embodiment of the field-effect transistor in the present disclosure.

Referring to FIG. 7, the present disclosure provides a second embodiment of the field-effect transistor, which comprises: a first insulating layer 202 formed on a silicon substrate 201, an active layer 203 on the first insulating layer 202, a source electrode 204 and a drain electrode 205 on the active layer 203, covering the source electrode 204 and the drain electrode 205 with a second insulating layer 206, and a gate electrode 207 on the second insulating layer.

Wherein the active layer 203 is a carbon quantum dots active layer.

The structure of each layer in the present embodiment is manufactured by the corresponding steps in the above method, and will not be described again.

Figure 8:
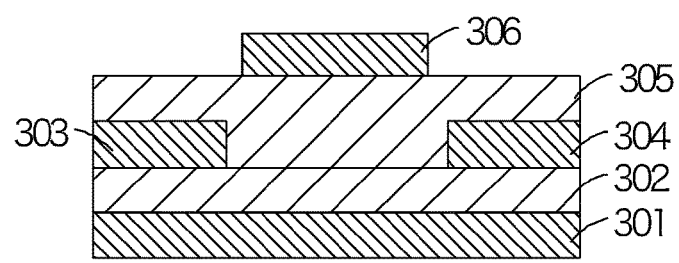
FIG. 8 is a schematic structure diagram showing the third embodiment of the field-effect transistor in the present disclosure.

Referring to FIG. 8, the present disclosure provides a third embodiment of the field-effect transistor, which comprises: an active layer 302 on a glass substrate 301, a source electrode 303 and a drain electrode 304 on the active layer 302, an insulating layer 305 on the source 303 and the drain electrode 304, and a gate electrode 306 on the insulating layer 305.

Wherein the active layer 302 is a carbon quantum dots active layer.

The structure of each layer in the present embodiment is manufactured by the corresponding steps in the above method, and will not be described again.

All the three field-effect transistor embodiments are top gate type field-effect transistors, and comprise the carbon quantum dots active layers.

Figure 9:
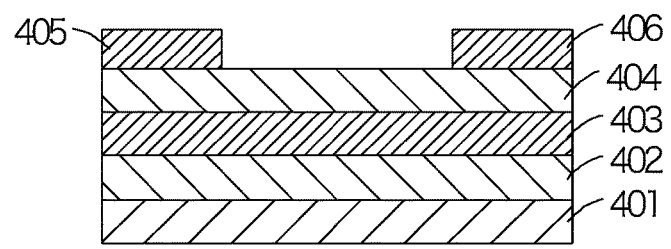
FIG. 9 is a schematic structure diagram showing the fourth embodiment of field-effect transistor in the present disclosure.

Referring to FIG. 9, the present disclosure provides a fourth embodiment of the field-effect transistor, which comprises: a gate electrode 402 and an insulating layer 403 are stacked in this order on a glass substrate 401, an active layer 404 on the insulating layer 403, a source electrode 405 and a drain electrode 406 on the active layer 404.

Wherein the active layer 404 is a carbon quantum dots active layer.

The structure of each layer in the present embodiment is manufactured by the corresponding steps in the above method, and will not be described again.

Figure 10:
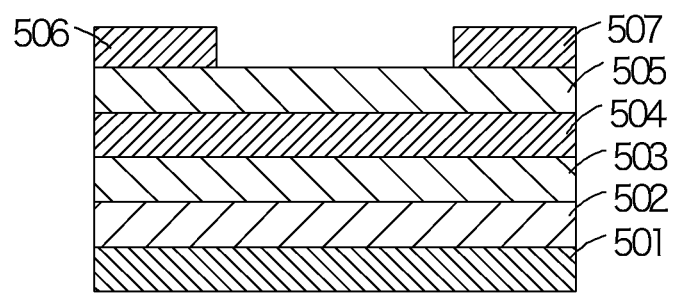
FIG. 10 is a schematic structure diagram showing the fifth embodiment of field-effect transistor in the present disclosure.

Referring to FIG. 10, the present disclosure provides a fifth embodiment of the field-effect transistor, which comprises: a first insulating layer 502 on a plastic substrate 501, a gate 503 on the first insulating layer 502, a second insulating layer 504 on the gate electrode 503, an active layer 505 on the second insulating layer 504, and a source electrode 506 and a drain electrode 507 located on the active layer 505.

Wherein the active layer 505 is a carbon quantum dots active layer.

The structure of each layer in the present embodiment is manufactured by the corresponding steps in the above method, and will not be described again.

Both the field-effect transistor embodiments are bottom gate type field-effect transistors, and include the carbon quantum dots active layers.

Apart from the current technology, the present disclosure provides a method comprising: depositing a first insulating layer on a substrate; forming a source electrode and a drain electrode on the first insulating layer, forming a carbon quantum dots active layer covering the source electrode and drain electrode; and forming a second insulating layer and a gate electrode on the carbon quantum dots active layer sequentially. Making the field-effect transistor active layer with carbon quantum dots as materials enriches the material of the field-effect transistor, reduces the environmental pollution in current technology by using metal dots film, and reduces the dependence on metal elements.

The above are only embodiments of the present disclosure is not patented and therefore limit the scope of the present disclosure, the use of any content of the present specification and drawings made equivalent or equivalent structural transformation process, either directly or indirectly in other relevant technical fields are included in the same way the scope of patent protection of the present disclosure.

What is claimed is:

1. A method for manufacturing a field-effect transistor, comprising:
   depositing a first insulating layer on a substrate;
   forming a source electrode and a drain electrode on the first insulating layer;
   forming a carbon quantum dots active layer covering the source electrode and the drain electrode; and
   forming a second insulating layer and a gate electrode on the carbon quantum dots active layer sequentially;
   wherein forming the carbon quantum dots active layer covering the source electrode and the drain electrode comprises:
      dissolving the carbon quantum dots in octane to form a first mixed solution;
      coating the first mixed solution on the first insulating layer, the source electrode and the drain electrode by a spin coating technology to form the carbon quantum dots film layer; and
      vacuum baking the carbon quantum dots film to form the carbon quantum dots active layer covering the source electrode and the drain electrode;
   wherein the first insulating layer depositing on a substrate further comprises:
      forming a first material layer on the substrate by a chemical vapor deposition method, the first material layer is a silicon oxide layer, an alumina layer, a silicon nitride layer, or a mixed layer of silicon oxide, aluminum oxide and silicon nitride;
      soaking and rinsing the first material layer with a second mixed solution; and
      drying the first material layer after soaking and rinsing to form the first insulating layer.

2. The method for manufacturing a field-effect transistor according to claim 1, wherein forming the source electrode and the drain electrode on the first insulating layer further comprises:
   forming a source metal layer and a drain metal layer on the first insulating layer by a vapor deposition method; and
   pattern processing the source metal layer and the drain metal layers to form the source electrode and the drain electrode.

3. The method for manufacturing a field-effect transistor according to claim 1, wherein forming the second insulating layer and the gate electrode on the carbon quantum dots active layer sequentially further comprises:
   forming a second material layer on the carbon quantum dots active layer by a chemical vapor deposition method, wherein the second material layer is a silicon oxide layer, an aluminum oxide layer, a silicon nitride layer or a mixed layer of the silicon oxide, the aluminum oxide and the silicon nitride;
   soaking and rinsing the second material layer by using the second mixed solution; and
   drying the second material layer after soaking and rinsing to form the second insulating layer.

4. The method for manufacturing a field-effect transistor according to claim 3, wherein forming the second insulating layer and the gate electrode on the carbon quantum dots active layer sequentially further comprises:
   forming a gate metal layer on the second insulating layer by a vapor deposition method; and
   pattern processing the gate metal layer to form the gate electrode.

5. The method for manufacturing a field-effect transistor according to claim 1, wherein the second mixed solution is a mixed solution of acetone, methanol and isopropanol.

* * * * *